(12) United States Patent
Smith et al.

(10) Patent No.: US 6,319,852 B1
(45) Date of Patent: Nov. 20, 2001

(54) NANOPOROUS DIELECTRIC THIN FILM FORMATION USING A POST-DEPOSITION CATALYST

(75) Inventors: Douglas M. Smith; Gregory P. Johnston; William C. Ackerman, all of Albuquerque, NM (US); Shin-Puu Jeng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/488,185

(22) Filed: Jan. 20, 2000

Related U.S. Application Data

(63) Continuation of application No. 08/746,688, filed on Nov. 14, 1996.
(60) Provisional application No. 60/006,861, filed on Nov. 16, 1995.

(51) Int. Cl.$^7$ .............................. H01L 21/31; B05D 3/04; B05D 3/12
(52) U.S. Cl. .......................... 438/778; 438/780; 438/782; 427/58; 427/126.3; 427/240; 427/337; 427/346; 427/352; 427/377; 427/389
(58) Field of Search ............................... 427/58, 384, 240, 427/126.3, 337, 352, 377, 346; 438/778, 787, 780, 782, 790

(56) References Cited

U.S. PATENT DOCUMENTS

| 3,652,216 | 3/1972 | Krekeler et al. ........................ 23/182 |
| 3,689,637 | 9/1972 | Pader ..................................... 424/52 |
| 3,860,431 | 1/1975 | Payne et al. ........................... 252/309 |

(List continued on next page.)

FOREIGN PATENT DOCUMENTS

| 0 382 310 A2 | 8/1990 | (EP) . |
| 0 454 239 A2 | 10/1991 | (EP) . |
| A-54 109765 | 8/1979 | (JP) . |
| A-06 293971 | 10/1994 | (JP) . |
| WO 92/03378 | 3/1992 | (WO) . |

OTHER PUBLICATIONS

Tillotson et al., "Transparent ultralow–density silica aerogels prepared by a two–step sol–gel process", Journal of Non–Crystalline Solids, 145 (1992), pp. 44–50.

(List continued on next page.)

Primary Examiner—Timothy Meeks
Assistant Examiner—Michael Barr
(74) Attorney, Agent, or Firm—David Denker; Wade James Brady, III; Frederick J. Telecky, Jr.

(57) ABSTRACT

This pertains generally to precursors and deposition methods suited to aerogel thin film fabrication of nanoporous dielectrics. An aerogel precursor sol is disclosed. This aerogel precursor sol contains a metal alkoxide (such as TEOS) and a solvent, but no gelation catalyst. By a method according to the present invention, such a precursor sol is applied as a nongelling thin film 14 to a semiconductor substrate 10. This substrate may contain patterned conductors 12, gaps 13, or other structures. An independent gelation catalyst (preferably, vapor phase ammonia) is added to promote rapid gelation of the thin film sol 14 at the desired time. One advantage is that it allows substantially independent control of gelation and pore fluid evaporation. This independent catalyst introduction allows additional processing steps to be performed between sol deposition and the onset of substantial gelation. One potential step is to evaporate a portion of the pore fluid solvent. Additional advantages of independent catalyst introduction are that it reduces the need for process steps requiring critical timing and provides a large increase in the pot life of the precursor sol.

26 Claims, 1 Drawing Sheet

U.S. PATENT DOCUMENTS

| | | | |
|---|---|---|---|
| 3,997,501 | 12/1976 | McLeod | 260/37 SB |
| 4,104,363 | 8/1978 | Vozka et al. | 423/338 |
| 4,169,926 | 10/1979 | McDaniel | 526/100 |
| 4,230,773 | 10/1980 | Bakos | 428/447 |
| 4,230,803 | 10/1980 | Weidenbach et al. | 435/176 |
| 4,311,738 | 1/1982 | Chi | 427/387 |
| 4,548,646 | 10/1985 | Mosser et al. | 106/14.12 |
| 4,584,365 | 4/1986 | Jada et al. | 528/271 |
| 4,608,316 | 8/1986 | Toda et al. | 428/446 |
| 4,652,467 | 3/1987 | Brinker et al. | 427/246 |
| 4,713,233 | 12/1987 | Marsh et al. | 423/608 |
| 4,851,150 | 7/1989 | Hench et al. | 252/315.6 |
| 4,943,542 | 7/1990 | Hayashi et al. | 501/12 |
| 4,954,327 | 9/1990 | Blount | 423/338 |
| 4,987,101 | 1/1991 | Kaanta et al. | 437/228 |
| 5,076,980 | 12/1991 | Nogues et al. | 264/65 |
| 5,091,009 | 2/1992 | Nogami et al. | 106/287.23 |
| 5,097,317 | 3/1992 | Fujimoto et al. | 357/72 |
| 5,103,288 | 4/1992 | Sakamoto et al. | 357/71 |
| 5,139,980 | 8/1992 | Nakahara et al. | 501/12 |
| 5,155,576 | 10/1992 | Mizushima | 357/71 |
| 5,207,814 | 5/1993 | Cogliati et al. | 65/18.3 |
| 5,226,930 | 7/1993 | Sasaki | 51/308 |
| 5,242,647 | 9/1993 | Poco | 264/225 |
| 5,270,027 | 12/1993 | Balducci et al. | 423/338 |
| 5,275,796 | 1/1994 | Tillotson et al. | 423/338 |
| 5,294,480 | 3/1994 | Mielke et al. | 428/240 |
| 5,302,548 | 4/1994 | Watanabe et al. | 437/187 |
| 5,320,983 | 6/1994 | Ouellet | 437/231 |
| 5,352,637 | 10/1994 | Fabry et al. | 437/238 |
| 5,366,887 * | 11/1994 | Hoshino et al. | 427/226 |
| 5,368,887 | 11/1994 | Hoshino et al. | 427/226 |
| 5,391,364 | 2/1995 | Cogliati | 423/335 |
| 5,393,712 | 2/1995 | Rostoker et al. | 437/238 |
| 5,405,805 | 4/1995 | Homma | 437/195 |
| 5,409,663 * | 4/1995 | Tillotson et al. | 423/338 |
| 5,409,683 | 4/1995 | Tillotson et al. | 423/338 |
| 5,457,073 | 10/1995 | Ouellet | 437/231 |
| 5,470,802 * | 11/1995 | Gnade et al. | 437/238 |
| 5,472,913 | 12/1995 | Havemann et al. | 437/195 |
| 5,488,015 | 1/1996 | Havemann et al. | 437/195 |
| 5,489,553 | 2/1996 | Chen | 437/195 |
| 5,494,858 | 2/1996 | Gnade et al. | 437/231 |
| 5,494,863 | 2/1996 | Mathur | 501/12 |
| 5,496,527 | 3/1996 | Yokogawa et al. | 423/338 |
| 5,504,042 | 4/1996 | Cho et al. | 437/247 |
| 5,519,250 | 5/1996 | Numata | 257/632 |
| 5,522,976 | 6/1996 | Campet et al. | 204/298.13 |
| 5,523,615 * | 6/1996 | Cho et al. | 257/632 |
| 5,525,857 | 6/1996 | Gnade et al. | 313/309 |
| 5,536,965 | 7/1996 | Beratan et al. | 257/444 |
| 5,548,159 | 8/1996 | Jeng | 257/634 |
| 5,561,318 | 10/1996 | Gnade et al. | 257/638 |
| 5,656,848 | 8/1997 | Beratan et al. | 257/446 |
| 5,661,344 | 8/1997 | Havemann et al. | 257/758 |
| 5,698,483 | 12/1997 | Ong et al. | 501/12 |
| 5,723,368 | 3/1998 | Cho et al. | 437/763 |
| 5,736,425 | 4/1998 | Smith et al. | 438/778 |
| 5,746,992 * | 5/1998 | Yoldas et al. | 423/338 |
| 5,747,880 | 5/1998 | Havemann et al. | 257/759 |
| 5,750,415 | 5/1998 | Gnade et al. | 427/195 |
| 5,753,305 | 5/1998 | Smith | 427/335 |
| 5,789,819 | 8/1998 | Gnade et al. | |
| 5,804,508 | 9/1998 | Gnade et al. | |
| 5,807,607 | 9/1998 | Smith et al. | |
| 5,847,443 | 12/1998 | Cho et al. | |
| 5,858,871 | 1/1999 | Jeng | |
| 5,955,140 | 9/1999 | Smith et al. | |
| 6,037,277 | 3/2000 | Maskara et al. | |
| 6,063,714 | 5/2000 | Smith et al. | |
| 6,130,152 | 10/2000 | Smith et al. | |
| 6,159,295 | 12/2000 | Maskara et al. | |
| 6,171,645 | 1/2001 | Smith et al. | |

OTHER PUBLICATIONS

D. Basmadjian et al., "The Control of the Pore Volume and Pore Size Distribution in Alumina and Silica Gels by the Addition of Water Soluble Organic Polymers", Dec. 1962, Journal of Catalysis, vol. 1, No. 6, pp. 547–563.

Fricke et al., "Aerogels", May 28, 1992, J. Am. Ceram. Soc., 75(8), pp. 2027–2036.

Einarsrud et al., Chem Process. Adv. Matl., (1992) pp. 355–361. (abstract only).

Haereid, Siv et al., "Mechanical Strengthening of TMOS–Based Alcogels by Aging in Silane Solutions", 1994, Journal of Sol–Gel Science and Tech., vol. 3, pp. 199–204.

Hrubesh et al., "Dielectric Properties of Aerogels", J. Materials Research, vol. 8, No. 7, Jul. 1993, pp. 1736–1741.

V. S. Klimenko, L. A. Kulik, and V. V. Vashchinskaya, "Dependence of the Composition and Structure of Silicic Acid Xerogels on the Nature of the Solvent", 1986, Ukrainskii Khimicheskii Zhurnal, vol. 52, No. 12, pp. 1247–1251.

Smith et al., "Preparation of low–density xerogels at ambient pressure", Journal of Non–Crystalline Solids, 186 (1995) pp. 104–112.

Yokogawa, H., Yokoyama, M., "Hydrophobic Silica Aerogels", Journal of Non–Crystalline Solids, 186 (1995) pp. 23–29.

Poco et al., "A rapid Supercritical Extraction Process for the Production of Silica Aerogels", Mat. Res. Soc. Symp. Proc. vol. 431 (1996) pp. 297–302, Materials Research Society.

Prakash et al., "Ambient–Pressure silica Aerogel Films", Mat. Res. Soc. Symp. Proc. vol. 371 (1995) pp. 205–210, Materials Research Society.

Smith et al., "Preparation of Low–Density Xerogels at Ambient Pressure for Low K Dielectrics", Mat. Res. Soc. Symp. Proc. vol. 371 (1995) pp. 261–272, Materials Research Society.

* cited by examiner

NANOPOROUS DIELECTRIC THIN FILM FORMATION USING A POST-DEPOSITION CATALYST

This Application is a continuation of U.S. application Ser. No. 08/746,688 filed Nov. 14, 1996, which claims priority from U.S. provisional application 60/006,861 filed Nov. 16, 1995.

FIELD OF THE INVENTION

This invention pertains generally to precursors and deposition methods for low dielectric constant thin films on semiconductor substrates, and more particularly to deposition methods suited to aerogel thin film fabrication of nanoporous dielectrics.

BACKGROUND OF THE INVENTION

Semiconductor fabricators have used sol-gel techniques to produce dense thin films in semiconductors. The word sol-gel, however, does not describe a product but a reaction mechanism whereby a sol transforms into a gel. A sol is a colloidal suspension of solid particles in a liquid. One method of forming a sol is through hydrolysis and condensation reactions. These reactions cause a multifunctional monomer in a solution to polymerize into relatively large, highly branched particles. Many monomers suitable for polymerization are metal alkoxides. For example, a tetraethylorthosilicate (TEOS) monomer may be partially hydrolyzed in water by the reaction $$Si(OEt)_4 + H_2O \rightarrow HO-Si(OEt)_3 + EtOH$$

Reaction conditions may be controlled such that, on the average, each monomer undergoes a desired number of hydrolysis reactions to partially or fully hydrolyze the monomer. TEOS which has been fully hydrolyzed becomes $Si(OH)_4$. Once a molecule has been at least partially hydrolyzed, two molecules can then link together in a condensation reaction, such as $$(OEt)_3Si-OH + HO-Si(OH)_3 \rightarrow (OEt)_3Si-O-Si(OH)_3 + H_2O$$

or $$(OEt)_3Si-OEt + HO-Si(OEt)_3 \rightarrow (OEt)_3Si-O-Si(OEt)_3 + EtOH$$

to form an oligomer and liberate a molecule of water or ethanol. The Si—O—Si configuration in the oligomer formed by these reactions has three sites available at each end for further hydrolysis and condensation. Thus, additional monomers or oligomers can be added to this molecule in a somewhat random fashion to create a highly branched polymeric molecule from literally thousands of monomers.

Through continued reactions, one molecule in the sol may eventually reach macroscopic dimensions so that it forms a network which extends throughout the sol. At this point (called the gel point), the substance is said to be a gel. By this definition, a gel is a substance that contains a continuous solid skeleton enclosing a continuous liquid phase. As the skeleton is porous, a gel can also be described as an open-pored solid structure enclosing a pore fluid. An oligomerized metal alkoxide, as defined herein, comprises molecules formed from at least two alkoxide monomers, but does not comprise a gel.

SUMMARY OF THE INVENTION

An ungelled precursor sol may be dip-coated or spin-coated onto a substrate to form a thin film on the order of several microns or less in thickness, gelled, and dried to form a dense film. The precursor sol often comprises a stock solution, a solvent, and a gelation catalyst. This catalyst typically modifies the pH of the precursor sol in order to speed gelation. In practice, such a thin film is subjected to rapid evaporation of volatile components, to the extent that the deposition, gelation, and drying phases may take place simultaneously as the film collapses rapidly to a dense film. Drying by evaporation of the pore fluid produces extreme capillary pressure in the microscopic pores of the wet gel. This pressure causes many pores to collapse and reduces the gel volume as it dries, typically by an order of magnitude or more.

A dried gel that is formed by collapsing and densifying a wet gel during drying has been termed a xerogel. U.S. patent application Ser. No. 08/247,195 to Gnade, Cho and Smith now U.S. Pat. No. 5,470,082 discloses a process for producing an aerogel thin film on a semiconductor substrate. An aerogel is distinguishable from a xerogel primarily by a manner of drying which largely avoids pore collapse during drying of the wet gel. This results in a substantially undensified thin film that can be fabricated with almost any desired porosity (thin films with greater than 90% porosity have been demonstrated). Such films have now been found to be desirable for a low dielectric constant insulation layer in microelectronic applications.

These techniques relate to fabricating inorganic dielectric (electrically nonconductive) materials. The inorganic porous dielectrics "aerogels" are preferably nanoporous having average pore sizes less than 500 nanometers (and more preferably less than 100 nanometers and still move preferably less than 25 nanometers). Nanoporous dielectrics are of particular interest in advanced semiconductor manufacturing. The nanoporous inorganic dielectrics include the nanoporous metal oxides, particularly nanoporous silica.

During conventional aerogel thin film formation, a catalyst such as ammonium hydroxide is typically mixed with the sol well prior to deposition. The catalyst typically operates to change the pH of the sol, thus initiating gelation. When a desired viscosity is reached prior to gelation, the sol is spun onto the wafer. Several properties of the film are related to its targeted density, including strength, pore size, and dielectric constant. Unfortunately, it has now been found that both density and film thickness are related to the viscosity of the sol at the time it is spun onto a wafer. Due to the rapid cross-linking which occurs in the film after addition of the catalyst, the apparent viscosity may change rapidly near the desired spin point. This apparent viscosity change may be so rapid that deposition time, catalyst concentration, and sol temperature may require exacting control to achieve a desired density and film thickness. The critical nature of this process not only makes it difficult to repeat, but nearly eliminates the possibility of sequential wafer processing at a common spin station.

The present invention generally provides a precursor sol and a method for deposition of aerogel thin films, e.g., for microelectronic applications in which the sol is not substantially gelling during deposition. In addition, sol viscosity is controlled and solvent evaporation is preferably either reduced or substantially halted during deposition.

For microelectronic applications, the precise control of film thickness and aerogel density are desirable. Several important properties of the film are related to the aerogel density, including mechanical strength, pore size and dielectric constant. It has now been found that both aerogel density and film thickness are related to the viscosity of the sol at the time it is spun onto a wafer. This presents a problem which was heretofore unrecognized. The problem being that with conventional precursor sols and deposition methods, it is extremely difficult to control both aerogel density and film thickness independently and accurately.

Aerogel thin films may be deposited on patterned wafers, e.g., over a level of patterned conductors. It has now been recognized that it may be useful to complete sol deposition before the onset of substantial gelation. This helps insure that gaps between such conductors remain adequately filled and that the surface of the gel remains substantially planar. To these ends, it is also desirable that no significant evaporation of pore fluid occur during gelation. Unfortunately, it is also desirable that the gel point be reachable as soon after deposition as possible to simplify processing, and the conventional method for speeding gelation of thin films is to allow evaporation to occur. It is recognized herein that a suitable precursor sol for aerogel deposition should allow control of film thickness, aerogel density, gap fill and planarity, and be relatively stable prior to deposition, yet allow rapid gelation that is controlled independently of deposition and evaporation.

A method has now been found which allows control of gelation to be performed substantially independent from evaporation of the pore fluid. In this method, the gelation catalyst is not included in the precursor sol. Instead, the catalyst is introduced during or after deposition of the sol on the substrate, thus removing the critical timing between sol spin-on and the onset of gelation. This independent introduction of the catalyst also allows additional processing steps to be performed between sol deposition and the onset of substantial gelation. Some potential steps are to evaporate a portion of the pore fluid solvent and/or halt the solvent evaporation. The additional evaporation step would allow the solid:liquid ratio present in the film at the gel point (and therefore the aerogel density) to be controlled relatively independently from the sol viscosity at deposition. This independent control may allow loosening the interdependence between thickness, deposition viscosity, and final porosity. Halting the evaporation helps obtain uniform pore size, fill gaps, and maintain surface planarity. An additional potential step would be the introduction of surface modifying agents into the sol after deposition on the wafer. An additional advantage of independent catalyst introduction is a large increase in the pot life of the precursor sol. This increased pot life allows the precursor sol to be prepared for multiple wafer batches at one time.

Several modifications may be suggested to this basic method. One such modification is to allow and/or promote the formation of moderate sized (15 to 150 monomers per molecule) oligomers in the precursor sol. These larger oligomers may speed the gelation process in the deposited sol. A sol containing large oligomers may have a higher viscosity than a sol with small oligomers. However, as long as the viscosity is stable, this higher viscosity can be compensated by methods known in the art, such as adjusting solvent ratios and spin conditions. To help achieve this desired stable viscosity, the oligomerization may need to be slowed or substantially halted before deposition. Potential methods of promoting oligomerization might include heating the precursor sol, evaporating solvent, or adding small amounts of gelation catalyst such as ammonium hydroxide. Potential methods of retarding oligomerization might include cooling the precursor sol, diluting the sol with a solvent, or restoring the precursor sol to a pH which minimizes condensation and gelation. (Nitric acid could be used in conjunction with the ammonium hydroxide exemplified above).

A method of forming a porous dielectric on a semiconductor substrate is disclosed herein. This method may comprise the steps of providing a semiconductor substrate having a first surface and depositing a thickness of an aerogel precursor sol upon the first surface of the substrate. This precursor sol is comprised of a reactant dispersed in a solvent and does not substantially gel during the deposition. This reactant is selected from the group of metal alkoxides, particulate metal oxides, and organic precursors. The method further comprises adding a gelation catalyst to the sol and allowing the sol to create a gel, where the gel comprises a porous solid and a pore fluid. The method also comprises removing the pore fluid without substantially collapsing the porous solid, thereby forming a dry, porous dielectric. Preferably, this deposition is performed in a controlled atmosphere and the gelation catalyst is a vapor phase catalyst. Preferably, this vapor phase catalyst is selected from the group comprising ammonia, low molecular weight amines, and volatile fluorine species; wherein ammonia is the most preferred.

BRIEF DESCRIPTION OF THE DRAWINGS

The present invention, including various features and advantages thereof, may be best understood with reference to the following drawings, wherein.

DETAILED DESCRIPTION OF THE PREFERRED EMBODIMENTS

Typical sol-gel thin film processes produce gels which collapse and densify upon drying, thus forming xerogels having limited porosity (Up to 60%, but generally substantially less than 50%). Under the uncontrolled drying conditions of xerogel film formation, it has been neither critical nor possible to completely separate the deposition, aggregation, gelation, and drying steps during formation of the thin film, as the entire process may be completed in a few seconds. However, it has now been found that such methods are generally unsuited for depositing aerogel thin films with a controllable aerogel density (Generally having porosity greater than 50%). Because an aerogel remains substantially undensified after drying, its final density is largely determined by the solid:liquid ratio in the film at the gel time. However, even though an aerogel avoids substantial pore collapse, there is often some shrinkage during drying that affects the final density. It has now been discovered that the following criteria are desirable for aerogel thin film deposition, particularly where the thin film is required to planarize and/or gap fill a patterned wafer:

1) a long pot life of the precursor sol,
2) no gelation during deposition,
3) no process steps requiring critical timing,
4) an adjustable dwell time between deposition and gelation, and/or
5) no substantial evaporation during gelation No prior art precursor sol and method have been found which allow meeting these conditions. However, in accordance with the present technique, it has now been found that a precursor sol which does not include a gelation catalyst, combined with a later introduction of a gelation catalyst, can substantially meet these conditions. This gelation catalyst can be a vapor phase catalyst in the process atmosphere. This catalyst then diffuses into the thin film sol-deposited on the wafer.

Figure 1:
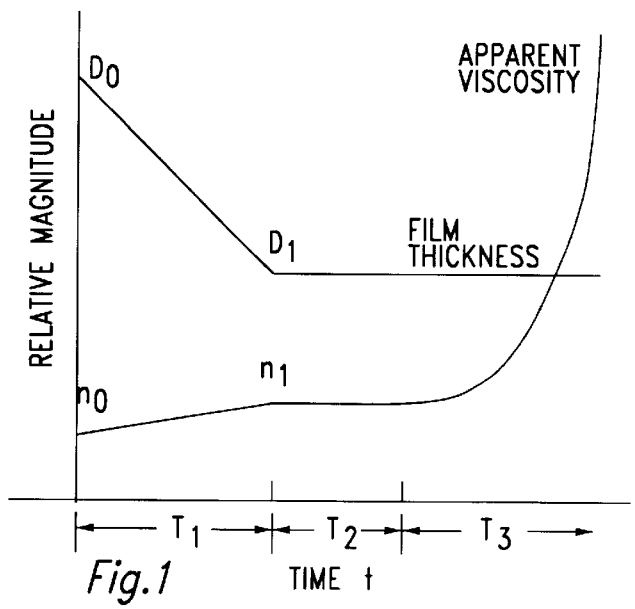
FIG. 1 contains a graph of relative film thickness and relative film apparent viscosity as a function of time for one embodiment of the present invention.

The method of depositing and gelling such a precursor sol can be best understood with reference to FIG. 1. As shown in FIG. 1 for time t=0, a multi-solvent (containing at least a first solvent and a second solvent) precursor sol that does not include a gelation catalyst may be spun onto a wafer at an initial film thickness $D_0$ and an initial viscosity $\eta_0$. This is preferably done in a controlled atmosphere having a partial pressure of the second solvent which greatly retards evaporation of the second solvent from the wafer. Thus after spin-on application, the first solvent is preferentially removed from the wafer during evaporation time period $T_1$ while the second solvent is maintained, thereby decreasing the film thickness to $D_1$. Viscosity also changes during this time to $\eta_1$, preferably due primarily to the removal of the first solvent (not, however, due to cross-linking of polymeric clusters in the sol). At the end of $T_1$, substantially all of the first solvent should be evaporated, at which time film thickness should stabilize or continue to shrink at a much reduced rate, thereby providing a predetermined liquid:solid ratio and thickness for the thin film at gel time.

During time period $T_1$ or $T_2$ a vapor-phase catalyst such as ammonia may be introduced into the controlled atmosphere; this catalyst diffuses into the thin film, further activating the sol and promoting rapid cross-linking. Time period $T_2$ has the primary purpose of providing separation between the endpoint of evaporation time period $T_1$ and the gel point which occurs during gelation time period $T_3$. Time period $T_2$ may therefore be set to 0, although some finite nonzero period is preferred to allow other process steps to be performed before gelation.

Although little or no evaporation preferably takes place during $T_3$, apparent viscosity should begin to increase substantially as cross-linking continues to link polymeric clusters. The apparent viscosity increases as the polymers grow and aggregate, in part because the liquid within a polymeric cluster is not available for flow.

Evaporation near the gel point may possibly result in lower porosity, as well as poor gap-fill and planarity for patterned wafers. Consequently, during gelation time period $T_3$, it may be useful to hold film thickness nearly constant until the gel point has passed by limiting solvent evaporation. Sometime during time period $T_3$, a marked change in apparent viscosity occurs as the sol nears the gel point, where large polymeric clusters finally join to create a spanning cluster which is continuous across the thin film.

Several advantages of this technique are apparent from FIG. 1. The independent, post-deposition catalyst introduction allows a solvent evaporation step to be added before substantial gelation, yet still allow rapid gelation. This additional evaporation step allows the film thickness to be changed from a first known value to a second known value which can be independently set by solvent ratios and spin conditions. Using this method, a low viscosity film may be applied, quickly reduced to a preset thickness, and rapidly gelled at a desired density.

Figure 2A:
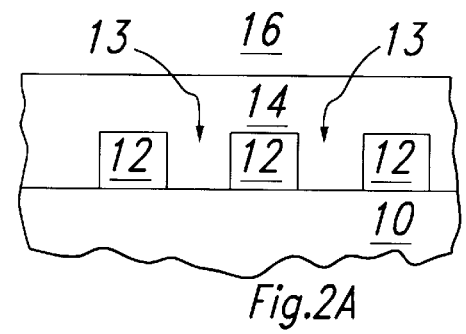
FIGS. 2A–2B contain cross-sections of a semiconductor substrate at several points during deposition of a thin film according to the present invention.

Referring now to FIG. 2A, a semiconductor substrate 10 (typically in wafer form) is shown. Common substrates include silicon, germanium, and gallium arsenide, and the substrate may include active devices, lower level wiring and insulation layers, and many other common structures not shown but known to those skilled in the art. Several patterned conductors 12 (e.g., of an Al-0.5%Cu composition) are shown on substrate 10. Conductors 12 typically run parallel for at least part of their length, such that they are separated by gaps 13 of a predetermined width (typically a fraction of a micron). Both the conductors and gaps may have height-to-width ratios much greater than shown, with larger ratios typically found in devices with smaller feature sizes.

In accordance with a first preferred embodiment of the present invention, a stock solution may be prepared by combining TEOS, ethanol, water and nitric acid in the approximate molar ratio 1:3:1:0.0007 and refluxing this solution for 1.5 hours at 80 C. to form a sol. This stock solution is typically stored below room temperature prior to use to maintain stability. The sol is further diluted using at least two solvents which differ in volatility, for example, ethanol (v.p.=89 torr @ 32 C.) and 1-butanol (v.p.=31 torr @ 32 C.) in molar ratios of solvent:TEOS of 5:1 and 10:1, respectively to form a multi-solvent precursor sol. Volume ratios of ethanol and 1-butanol may be adjusted to any desired ratio depending on desired film thickness and density.

3–5 ml of this multi-solvent precursor sol may be dispensed at room temperature onto substrate 10, which is then spun at 1500 to 5000 rpm (depending on desired film thickness) for about 5–10 seconds to form sol thin film 14. This is preferably done in a saturated 1-butanol and water atmosphere 16. This permits rapid evaporation of the ethanol from film 14 without substantial evaporation of the 1-butanol and water.

At a predetermined time, ammonia vapor is added to the atmosphere. Preferably, the ammonia is added until a saturated vapor or near-saturated vapor is formed. As the ammonia diffuses into the sol thin film, rapid gelation is promoted. This ammonia-laden atmosphere is preferably maintained at least until gelation is complete.

Figure 2B:
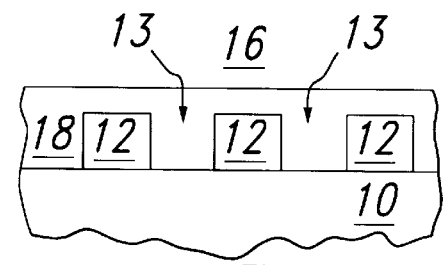

FIG. 2B shows a reduced thickness sol film 18 obtained after substantially all (about 95% or more) of the ethanol has been removed. Film 18 has a known ratio of silicon to pore fluid at the gel point, which is approximately equal to the ratio of TEOS to water and 1-butanol in the as-deposited sol (with minor changes due to continued reactions and incidental evaporation). To the extent that the gel is prevented from collapsing, this ratio will determine the density of the aerogel film which will be produced from the sol thin film.

After gelation, the wet gel can preferably be allowed time to age, generally about a day at room temperature, at one or more controlled temperatures. Aging may preferably be accomplished by letting the device sit in a saturated ethanol atmosphere for approximately 2 hours at about 50 degrees C.

Film 18 may be dried without substantial densification by one of several methods, including supercritical fluid extraction. However, the preferred method is to surface modify the pore surfaces in the wet gel before drying, using a surface modifying agent such as trimethylchlorosilane, and follow this with slow drying of the film in a controlled atmosphere. In this method, the water may be removed from the wet gel, preferably by immersing the wafer in pure ethanol. In this example, a surface modification step is performed on the wet gel, replacing a substantial number of the molecules on the pore walls with those of another species. Surface modification may be performed, for example, by immersing the wafer in a hexane solution containing about 10% by volume trimethylchlorosilane (TMCS). This surface modification typically replaces reactive surface groups such as hydroxyls and alkoxyls with more stable surface groups such as methyl groups, thereby controlling undesirable condensation reactions (and shrinkage effects) during gel drying. Typically, approximately 30% of the reactive surface groups must be replaced to substantially alleviate densification.

After a brief reaction time, the unreacted surface modification compound is usually removed by immersing the wafer in an aprotic solvent (e.g. acetone, hexane) and allowing excess solvent to drain. After this solvent exchange, solvent is finally allowed to evaporate from the wet gel, forming a dry porous dielectric (dried gel).

In order to reduce the dielectric constant, it is preferable to dehydroxylate (anneal) the dried gel. This may be done by placing the example wafer in a forming gas atmosphere comprised of 10 volume % H2, 90 volume % N2 at atmospheric pressure, and baking at 450 C. for approximately 30 minutes.

Figure 3:
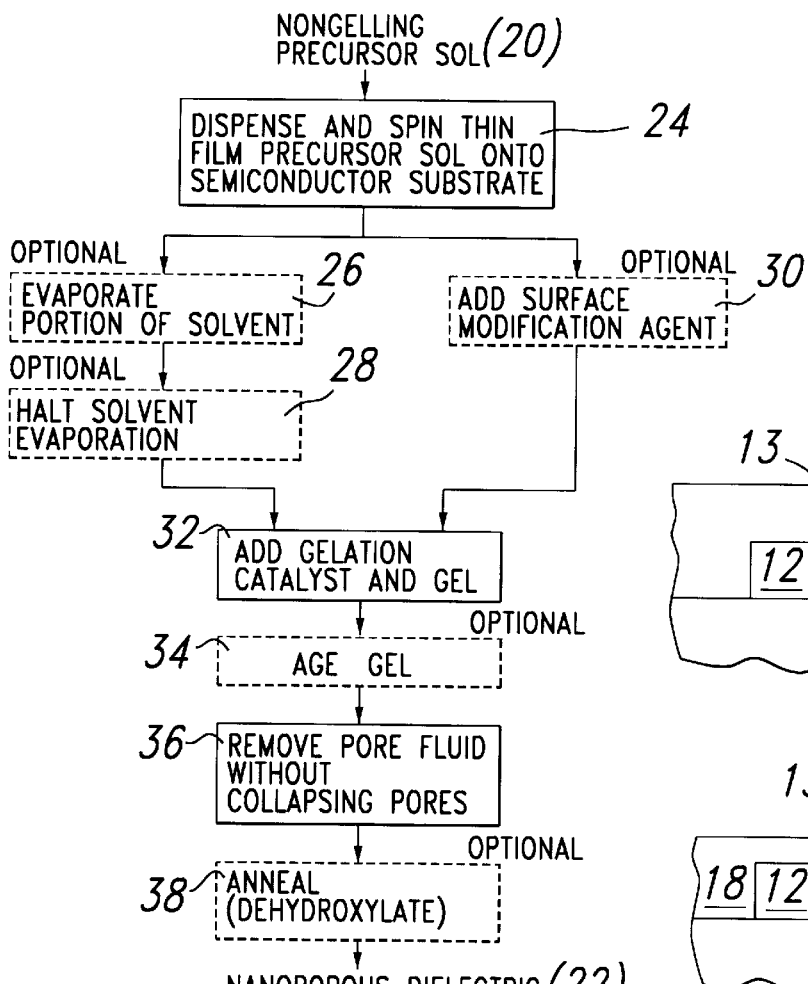
FIG. 3 is a flow chart of a deposition process according to the present invention.

FIG. 3 contains a flow chart of a general method for obtaining an aerogel thin film from a precursor sol according to one embodiment of the present invention.

In accordance with a second preferred embodiment of the present invention, a film of ammonia can be condensed onto or otherwise applied to a semiconductor substrate before dispensing the multi-solvent precursor sol. 3–5 ml of a multi-solvent precursor sol may be dispensed at room temperature onto substrate 10, which is then spun at 1500 to 5000 rpm (depending on desired film thickness) for about 5–10 seconds to form sol thin film 14. This is preferably done in a saturated 1-butanol and water atmosphere 16. This permits rapid evaporation of the ethanol from film 14 without substantial evaporation of the 1-butanol and water. This approach takes advantage of the time delay between the catalyst/precursor sol contact and the onset of gelation.

FIG. 2B shows a reduced thickness sol film 18 obtained after substantially all (about 95% or more) of the ethanol has been removed. Film 18 has a known ratio of silicon to pore fluid at the gel point, which is approximately equal to the ratio of TEOS to water and 1-butanol in the as-deposited sol (with minor changes due to continued reactions and incidental evaporation). To the extent that the gel is prevented from collapsing, this ratio will determine the density of the aerogel film which will be produced from the sol thin film.

Film 18 may be dried without substantial densification by one of several methods, including supercritical fluid extraction. However, the preferred method is to surface modify the pore surfaces in the wet gel prior to drying, using a surface modifying agent such as trimethylchlorosilane, and follow this with slow drying of the film in a controlled atmosphere.

Other gelation catalysts may be used in place of ammonia without departing from the scope of this invention. Some examples of other gelation catalysts include the volatile amine species (low molecular weight amines) and volatile fluorine species.

Many of these steps may be modified within the scope of the invention, and other steps can be included to enhance the overall process. For example, the initial thin film may be deposited by other common methods, such as dip-coating or spray-coating instead of spin-coating. The precursor sol may contain moderate sized oligomers. The precursor sol may contain only a single solvent, instead of multiple solvents. Preferably, the precursor sol may be maintained at least slightly acidic before deposition. The surface modifying agent may be added to the precursor sol before depositing the sol on the wafer. Alternatively, the surface modifying agent may be added to the thin film sol or reaction atmosphere after deposition but before gelation. While water might be considered a solvent in such a process, for discussion purposes herein, water is not considered a solvent.

Other examples of modifications involve the reaction atmosphere and/or temperature. These examples include introducing the vapor phase catalyst before or during the sol deposition. Also coating and gelation need not be performed in the same chamber or even in the same atmosphere. For instance, coating may be done without a controlled ambient (particularly if the low volatility components do not evaporate rapidly at room conditions), or in an ambient that also prevents evaporation of high volatility components. The reaction atmosphere may have its temperature elevated above the substrate temperature in order to condense the vapor phase catalyst onto the substrate. Additionally, the substrate may have its temperature elevated to speed gelation. Also, total pressure and/or temperature may be varied to further control evaporation rates and/or gel time. Elevated temperature processing is typically performed at no less than 40° C.; however, 50° C. is preferred, and 70° C. is more preferred. When working at elevated temperatures, the partial pressures in the reaction atmosphere must be high enough to prevent solvent boiling.

Although TEOS has been used as a representative example, other metal alkoxides may be used either alone or in combination with TEOS or each other to form a silica network. These metal alkoxides include tetramethylorthosilicate (TMOS), methyltriethoxysilane (MTEOS), and 1,2-Bis(trimethoxysilyl)ethane (BTMSE). A sol may also be formed from alkoxides of other metals such as aluminum and titanium. Other precursors sols known in the art include particulate metal oxides and organic precursors. Two representative particulate metal oxides are particulate silica and colloidal silica. Two representative organic precursors are melamine and resorcinol.

Although the present invention has been described with several sample embodiments, various changes and modifications may be suggested to one skilled in the art. It is intended that the present invention encompass such changes and modifications as fall within the scope of the appended claims.

What is claimed is:

1. A method for forming a nanoporous dielectric on a semiconductor substrate; the method comprising the steps of:
    a) providing a semiconductor substrate having a first surface;
    b) depositing a thickness of an aerogel precursor sol upon said first surface of said substrate;
wherein
    said precursor sol is comprised of a reactant dispersed in a solvent; wherein said reactant is selected from the group consisting of metal alkoxides, particulate metal oxides, and organic precursors; and
    said precursor sol does not substantially gel during said deposition;
    c) adding a gelation catalyst to said deposited sol;
    d) allowing said deposited sol to create a gel, wherein said gel comprises a porous solid and a pore fluid; and
    e) removing said pore fluid without substantially collapsing said porous solid, thereby forming a dry, porous dielectric.

2. The method of claim 1, wherein:
    said addition of a gelation catalyst occurs directly after said deposition.

3. The method of claim 1, wherein:
    evaporation of said solvent is substantially halted prior to said addition of said gelation catalyst.

4. The method of claim 1, wherein:
    a surface modifying agent is added to said sol after said deposition, but prior to said addition of said gelation catalyst.

5. The method of claim 1, wherein:

said gelation catalyst is selected from the group consisting of ammonia, volatile amine species, and volatile fluorine species.

6. The method of claim 1, wherein:

said gelation catalyst is ammonia.

7. The method of claim 1, further comprising the step of:

elevating the temperature of said substrate to at least 40 degrees Celsius.

8. The method of claim 1, further comprising the steps of:

aging said gel; and annealing said dry, porous dielectric.

9. The method of claim 1, wherein:

said depositing a thickness of an aerogel precursor sol upon said first surface comprises spin-coating said aerogel precursor sol onto said first surface.

10. The method of claim 1, wherein:

said solvent comprises a first liquid and a second liquid, said first liquid having a vapor pressure which is higher than the vapor pressure of said second liquid.

11. The method of claim 1, wherein:

said reactant is an oligomerized metal alkoxide.

12. The method of claim 1, wherein:

said reactant is a metal alkoxide selected from the group consisting of tetraethylorthosilicate, tetramethylorthosilicate, methyltriethoxysilane, 1,2-Bis(trimethoxysilyl)ethane and combinations thereof.

13. A method for forming a nanoporous dielectric on a semiconductor substrate; the method comprising the steps of:

a) providing a semiconductor substrate having a first surface;

b) depositing a thickness of an aerogel precursor sol upon said first surface of said substrate;

wherein said precursor sol is comprised of a reactant dispersed in a solvent; wherein said reactant is selected from the group consisting of metal alkoxides, particulate metal oxides, and organic precursors; and said precursor sol does not substantially gel before said depositing is complete;

c) adding a gelation catalyst to said deposited sol, wherein:

said adding is performed in an atmosphere; and said gelation catalyst is a vapor phase catalyst;

d) allowing said deposited sol to create a gel, wherein said gel comprises a porous solid and a pore fluid; and e) removing said pore fluid without substantially collapsing said porous solid.

14. The method of claim 13, wherein:

said vapor phase catalyst is selected from the group consisting of ammonia, volatile amine species, and volatile fluorine species.

15. The method of claim 13, wherein:

said vapor phase catalyst is ammonia.

16. The method of claim 13, wherein:

said vapor phase catalyst is introduced to said atmosphere after said depositing a thickness of a precursor sol upon said substrate.

17. The method of claim 13, wherein:

the temperature of said atmosphere is greater than the temperature of said substrate.

18. A method for forming a nanoporous dielectric on a semiconductor substrate; the method comprising the steps of:

a) providing a semiconductor substrate having a first surface;

b) depositing a thickness of an aerogel precursor sol upon said first surface of said substrate;

wherein said precursor sol is comprised of a reactant dispersed in a solvent; wherein said reactant is selected from the group consisting of metal alkoxides, particulate metal oxides, and organic precursors; and said precursor sol does not substantially gel before said depositing is complete;

c) evaporating a portion of said solvent;

d) adding a gelation catalyst to said deposited sol; and e) allowing said deposited sol to create a gel, wherein said gel comprises a porous solid and a pore fluid; and f) removing said pore fluid without substantially collapsing said porous solid.

19. The method of claim 18, wherein:

evaporation of said solvent is substantially halted prior to said addition of said gelation catalyst.

20. A method for forming a porous dielectric on a semiconductor substrate; the method comprising the steps of:

a) providing a semiconductor substrate having a first surface;

b) depositing a thickness of an aerogel precursor sol upon said first surface of said substrate;

wherein said precursor sol is comprised of a reactant dispersed in a solvent; wherein said reactant is selected from the group consisting of metal alkoxides, particulate metal oxides, and organic precursors;

a portion of said reactant has been transformed into oligomers having at least 15 monomers per oligomer; and said precursor sol does not substantially gel during said deposition;

c) adding a gelation catalyst to said deposited sol; and d) allowing said deposited sol to create a gel, wherein said gel comprises a porous solid and a pore fluid.

21. The method of claim 20, wherein:

said gelation catalyst is a vapor phase catalyst.

22. The method of claim 20, wherein:

said gelation catalyst is selected from the group consisting of ammonia, volatile amine species, and volatile fluorine species.

23. The method of claim 20, wherein:

said gelation catalyst is ammonia.

24. A method for forming a nanoporous dielectric on a semiconductor substrate, the method comprising the steps of:

providing a semiconductor substrate having a first surface;

depositing a thickness of an aerogel precursor sol upon the first surface of the substrate; wherein the precursor sol is substantially non-gelling;

adding a gelation catalyst to the deposited sol; and allowing the deposited sol to create a gel, wherein the gel comprises a porous solid and a pore fluid; and removing the pore fluid without substantially collapsing the porous solid.

25. The method of claim 24, wherein a portion of the solvent evaporates before the gelation catalyst is added.

26. The method of claim 25, wherein the solvent evaporation substantially halts prior to the addition of the gelation catalyst.

* * * * *